United States Patent
Viegas

(10) Patent No.: US 9,647,670 B2
(45) Date of Patent: May 9, 2017

(54) OSCILLATOR WITH DYNAMIC GAIN CONTROL

(71) Applicant: Silicon Laboratories Inc., Austin, TX (US)

(72) Inventor: Eduardo Viegas, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 0 days.

(21) Appl. No.: 14/854,833

(22) Filed: Sep. 15, 2015

(65) Prior Publication Data

US 2017/0077931 A1   Mar. 16, 2017

(51) Int. Cl.
| | | |
|---|---|---|
| H03B 5/30 | (2006.01) | |
| H03L 3/00 | (2006.01) | |
| H03G 3/00 | (2006.01) | |
| H03B 5/32 | (2006.01) | |

(52) U.S. Cl.
CPC ............ *H03L 3/00* (2013.01); *H03B 5/32* (2013.01); *H03G 3/001* (2013.01)

(58) Field of Classification Search
CPC ............ H03L 3/00; H03G 3/001; H03B 5/32
USPC ...... 331/15, 109, 115, 116 R, 132, 182, 183, 331/185, 186
See application file for complete search history.

(56) References Cited

U.S. PATENT DOCUMENTS

| | | | | |
|---|---|---|---|---|
| 7,030,709 B2 * | 4/2006 | Novac | ................ | H03B 5/364 |
| | | | | 331/116 FE |
| 7,035,607 B2 | 4/2006 | Lim et al. | | |
| 7,123,113 B1 * | 10/2006 | Brennan | ................ | H03L 5/00 |
| | | | | 331/116 FE |
| 7,200,364 B2 | 4/2007 | Lim et al. | | |
| 8,665,033 B2 * | 3/2014 | Tang | ................ | H03B 5/1228 |
| | | | | 331/117 FE |
| 2008/0246548 A1 * | 10/2008 | Fagg | ................ | H03B 5/06 |
| | | | | 331/132 |
| 2009/0002087 A1 * | 1/2009 | Toffolon | ................ | H03L 3/00 |
| | | | | 331/186 |
| 2012/0306585 A1 * | 12/2012 | Mack | ................ | H03B 5/30 |
| | | | | 331/182 |
| 2012/0326794 A1 | 12/2012 | Kammula | | |
| 2014/0009234 A1 * | 1/2014 | Aichner | ................ | H03B 5/36 |
| | | | | 331/49 |

(Continued)

OTHER PUBLICATIONS

Eric A. Vittoz, Marc G.R. Degrauwe and Serge Bitz, "High-Performance Crystal Oscillator Circuits: Theory and Application," IEEE Journal of Solid-State Circuits, vol. 23, No. 3, Jun. 1988, pp. 774-783.

(Continued)

*Primary Examiner* — Richard Tan
(74) *Attorney, Agent, or Firm* — Polansky & Associates, P.L.L.C.; Paul J. Polansky

(57) ABSTRACT

In one form, an oscillator includes an oscillator core circuit and a dynamic gain control circuit. The oscillator core circuit is for connection to a frequency reference element and provides a first clock signal using a negative gain element having a gain determined by a gain control signal. The dynamic gain control circuit provides the gain control signal to set an absolute value of the gain to a first level during a startup state, and changes the gain control signal to reduce the absolute value of the gain to a second level lower than the first level after the first clock signal has reached a steady state.

23 Claims, 4 Drawing Sheets

(56) References Cited

U.S. PATENT DOCUMENTS

2014/0266487 A1* 9/2014 Vaishnav .................. H03L 5/00
  331/183

OTHER PUBLICATIONS

Silicon Laboratories Inc., "EFM32HG108 Datasheet," EFM32HG108FXX, Rev. 0.91, May 6, 2015, 53 pages.

* cited by examiner

US 9,647,670 B2

OSCILLATOR WITH DYNAMIC GAIN CONTROL

FIELD OF THE DISCLOSURE

The present disclosure relates generally to oscillators, and more particularly to oscillators with gain control.

BACKGROUND

Crystal oscillators are used for a variety of analog and digital electronic products such as microprocessors, microcontrollers, radio transmitters and receivers, and the like. Crystal oscillators use the resonance characteristics of quartz crystals to provide references for the generation of very accurate clock frequencies. Crystal oscillator circuits generally use tank capacitors connected to crystal terminals with a negative gain element between them to start and maintain oscillation at the desired frequency. In simple crystal oscillator circuits, an inverter provides the negative loop gain. Other crystal oscillator circuits use variable loop gain elements and gain control circuits to establish a gain that is sufficient to start oscillations but also low enough to avoid excessive power consumption during steady state operation. However because crystal oscillators consume significant amounts of power, it would be desirable to reduce power consumption further, especially for very low power products that use batteries.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

An oscillator as described herein is suitable for use in very low power applications that run on a battery. The oscillator controls the gain of a negative gain element, such as a transconductance amplifier, dynamically. A dynamic gain control circuit provides a gain control signal to the negative gain element to set an absolute value of the gain to a first level during a startup state, and changes the gain control signal to reduce the absolute value of the gain to a second level lower than the first level after the first clock signal has reached a steady state. In this way, the oscillator achieves fast startup but also has very low power consumption during steady state operation. It performs the control digitally, which allows various programmable options so that the control can be tailored for the particular oscillator, such as by altering the tradeoffs between low power consumption and fast recovery from low power states.

Figure 1:
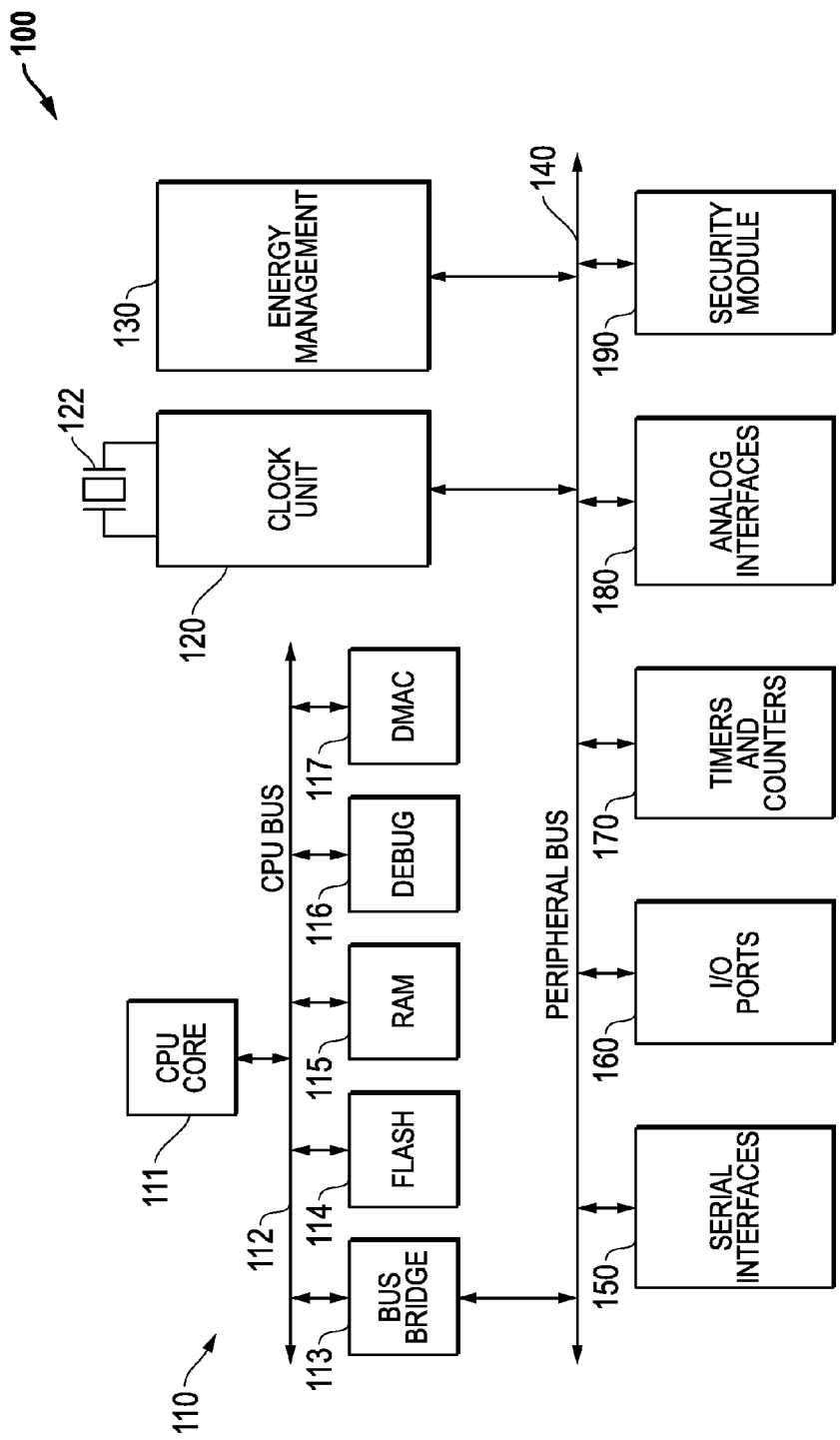
FIG. 1 illustrates in block diagram form a microcontroller having a crystal oscillator circuit.

FIG. 1 illustrates in block diagram form a microcontroller (MCU) 100 having a crystal oscillator circuit. The crystal oscillator circuit forms part of a clock unit 120. MCU 100 includes generally a central processing unit (CPU) system 110, clock unit 120, an energy management circuit 130, a peripheral bus 140, a set of serial interfaces 150, a set of input/output (I/O ports) 160, a set of timers and counters 170, a set of analog interfaces 180, and a security module 190.

CPU system 110 includes a CPU bus 112 interconnecting a CPU core 111, a bus bridge 113, a FLASH memory 114, a random access memory (RAM) 115, a debug circuit 116, and a direct memory access (DMA) controller (DMAC) 117. CPU system 110 includes a CPU bus 112 separate from peripheral bus 140 to isolate transactions initiated by CPU core 111 to local devices and memory without affecting traffic on peripheral bus 140. Bus bridge 113 is a circuit that allows cross-bus transfers between CPU bus 112 and peripheral bus 140. CPU system 110 provides FLASH memory 114 for non-volatile storage of program code that can be bootstrap loaded from an external source, as well as parameters that need to be preserved when MCU 100 is powered down. RAM 115 provides a working memory for use by CPU core 111. Debug circuit 116 provides program trace capabilities with access to registers on CPU core 111 for software debug. DMAC 117 provides programmable DMA channels to offload CPU core 111 from routine data movement tasks between peripherals and memory.

MCU 100 includes a set of peripherals that make it suitable for a variety of general purpose embedded applications. Peripheral bus 140 interconnects bus bridge 113, clock unit 120, energy management circuit 130, serial interfaces 150, I/O ports 160, timers and counters 170, analog interfaces 180, and security module 190. Serial interfaces 150 operate according to a variety of synchronous and asynchronous character-oriented and serial protocols. I/O ports 160 are a set of general-purpose input/output circuits and terminals that can be programmed for specific functions or remain available to software for general purpose operation. Timers and counters 170 provide various programmable timing and event counting functions useful for embedded control, and include a watchdog timer and a real time clock. Analog interfaces 180 include an analog comparator and analog-to-digital converter (ADC) for accurate analog input signal measurement. Security module 190 provides an encryption function that is useful for data communication and storage in secure environments.

Generally MCU 100 integrates CPU system 110 and several peripherals and is suitable for very low power operation. To facilitate low power operation, MCU 100 includes an energy management circuit 130 that provides several programmable functions to support extremely low power operation. For example energy management circuit 130 can include a voltage regulator to provide a precise internal power supply voltage that is sufficient for the internal operating speed but low enough in voltage to reduce power consumption. It can also include a brown-out detector designed to force MCU 100 into reset when power consumption is too high, as well as a low-power power on reset circuit.

In addition, MCU 100 includes a clock unit 120 with a variety of clocks and clock functions that MCU 100 uses to support its low power modes. For example, clock unit 120 can include high frequency oscillators based on crystal references, as well as lower precision fully integrated resistor-capacitor (RC) oscillators and very low speed RC oscillators that allow standby and keep-alive operations. Shown in FIG. 1 is a crystal resonator 122 that can be used with a crystal oscillator circuit in clock unit 120 to form a high frequency oscillator that has enhanced low power modes. The oscillator will now be described.

Figure 2:
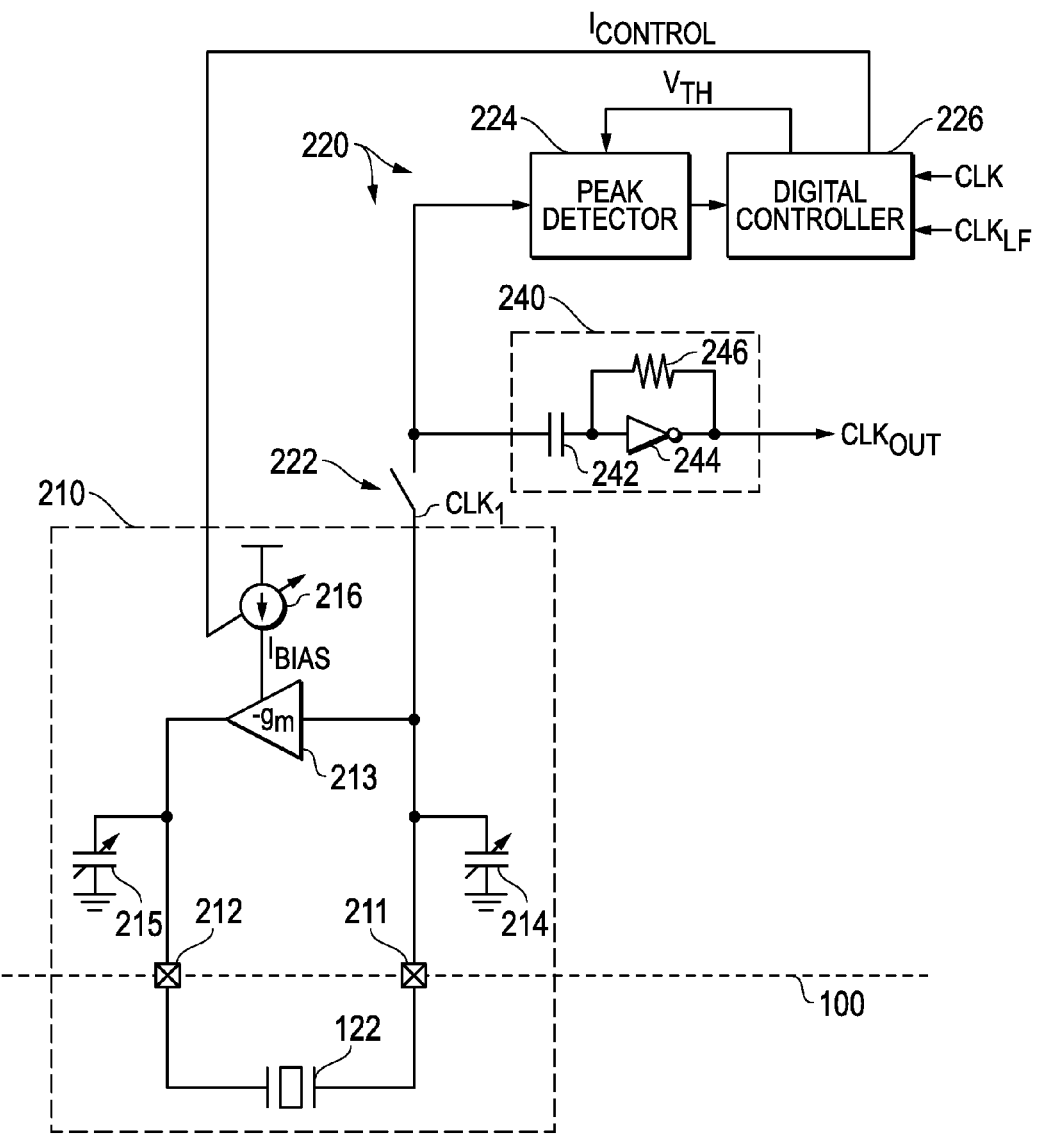
FIG. 2 illustrates in partial block diagram and partial schematic form an oscillator with gain control according to an embodiment of the present invention.

FIG. 2 illustrates in partial block diagram and partial schematic form an oscillator 200 with gain control according to an embodiment of the present invention. Oscillator 200 includes generally an oscillator core circuit 210, a dynamic gain control circuit 220, and a buffer 240. Oscillator core circuit 210 includes external terminals 211 and 212, a negative gain element in the form of a transconductance amplifier 213, variable capacitors 214 and 215, and a variable current source 216. External terminals 211 and 212 provide interconnection points to the terminals of an external reference element, such as crystal resonator 122. Transconductance amplifier 213 has an input connected to external terminal 211, a control input, and an output connected to external terminal 212. Variable capacitor 214 has a first terminal connected to external terminal 211, a control terminal, and a second terminal connected to ground. Variable capacitor 215 has a first terminal connected to external terminal 212, a control terminal, and a second terminal connected to ground. Variable current source 216 has a first terminal connected to a positive power supply voltage terminal, a control input for receiving a signal labeled "$I_{CONTROL}$", and a second terminal connected to the control input of transconductance amplifier 213.

Dynamic gain control circuit 220 includes a switch 222, a peak detector 224, and a digital controller 226. Switch 222 has a first switch terminal connected to external terminal 211 for receiving a signal labeled "$CLK_1$", a second switch terminal, and a control terminal for receiving a control signal (not shown in FIG. 2). Peak detector 224 has an input connected to the second terminal of switch 222, a control input for receiving a signal labeled "$V_{TH}$", and an output. Digital controller 226 has a first input connected to the output of peak detector 224, a second input for receiving a clock signal labeled "CLK", a third input for receiving a clock signal labeled "$CLK_{LF}$", a first output connected to the control input of peak detector 224 for providing signal $V_{TH}$, and a second output connected to the control input of variable current source 216 for providing signal $I_{CONTROL}$.

Buffer 240 has an input and an output for providing a signal labeled "$CLK_{OUT}$", and includes a capacitor 242, an inverter 244, and a resistor 246. Capacitor 242 has a first terminal connected to the second terminal of switch 222, and a second terminal. Inverter 244 has an input connected to the second terminal of capacitor 242, and an output for providing the $CLK_{OUT}$ signal. Resistor 246 has a first terminal connected to the output of inverter 244, and a second terminal connected to the input of inverter 244.

Oscillator core circuit 210 operates with external (e.g. off-chip) crystal resonator 122 to form a Pierce oscillator. Transconductance amplifier 213 provides a negative gain between the terminals of crystal resonator 122 to start and sustain oscillation. As is known, crystal resonator 122 operates as a frequency reference element and has a resonant frequency that is determined to a high degree of precision by its physical characteristics. Transconductance amplifier 213 provides a negative transconductance labeled "$-g_m$" between its input and output of a magnitude determined by variable current source 216. Thus oscillator 200 uses the $I_{CONTROL}$ signal as a gain control signal to vary the gain (transconductance) based on the mode of operation of MCU 100.

Note that in the following discussion, when "gain" is referred to, absolute value of gain is intended. For example the expression "lower gain" means a gain whose absolute value is lower.

Digital controller 226 places switch 222 in the open position when oscillator 200 is in a low power mode known as the keep warm mode by disconnecting any significant loading, other than through the input impedance of transconductance amplifier 213 and variable capacitors 214 and 215. Digital controller 226 places switch 222 in the closed position either in a normal operation mode when buffer 240 provides the $CLK_{OUT}$ signal, or in a calibration mode when peak detector 224 and digital controller 226 operate to calibrate the value of $I_{CONTROL}$. Note that switch 222 also protects internal circuits from electrostatic discharge (ESD) events and disconnects dynamic gain control circuit 220 from terminals 211 and 222 when they are used for other purposes that may expose them to high voltages or high activity.

Peak detector 224 determines the peak amplitude of clock signal $CLK_1$. In particular, it determines whether the peak amplitude of $CLK_1$ exceeds $V_{TH}$. If so, it provides a signal to digital controller 226 for use in determining a calibrated value for $I_{CONTROL}$. As will be apparent with respect to the description below, digital controller 226 can change $V_{TH}$ for different calibration modes.

Buffer 240 buffers $CLK_1$ to form a digital square wave clock signal. Capacitor 242 blocks average (DC) voltages and only passes high frequency components. Thus buffer 240 forms the $CLK_{OUT}$ signal to reject any common mode or DC bias from oscillator core circuit 210.

In general, digital controller 226 provides voltage threshold signal $V_{TH}$ at one threshold and $I_{CONTROL}$ at a first gain during a startup mode. During the startup mode, digital controller 226 sets $I_{CONTROL}$ to set a high gain to allow fast startup. In one example, digital controller 226 can start up oscillator core circuit 210 in about 200 microseconds (μsec). Once peak detector 220 determines that the amplitude of the clock signal exceeds the threshold, then digital controller 226 reduces $I_{CONTROL}$ to produce a gain in transconductance amplifier 213 that is lower than in the startup mode to reduce power consumption, but is sufficiently high to maintain reliable oscillation.

Digital controller 226 has two calibration modes. The first calibration mode is known as steady state calibration in which digital controller 226 calibrates an acceptable gain level for normal, steady state operation, i.e. after the oscillator has stabilized. It does this by establishing an initial gain and then reducing the gain until the peak reaches a lower threshold.

The second calibration mode is known as keep warm calibration in which digital controller 226 calibrates an acceptable gain level for low power operation, i.e. when oscillator core circuit 210 does not drive any actual circuits. It does this by lowering the gain below the steady state gain to an even lower level in small steps.

Known analog gain control loops control the gain to a level sufficient for low power operation in the steady state, but require a long startup time. Moreover they draw appreciable supply current, which is not desirable for extremely low power operation. On the other hand, the digitally controlled oscillator disclosed herein dynamically distinguishes between startup and steady state operation, providing high gain for fast startup but reduced gain for low power operation during steady state. The digital control makes certain programmable settings or "knobs" available to the programmer to tailor operating parameters to the characteristics of the particular application and thus provides a high degree of flexibility. For example and as will be explained further below, oscillator 200 also provides the keep warm state during which MCU 100 is inactive but the oscillator continues to oscillate at a greatly reduced gain, and thus can be restarted much faster than from a static or off state. The knobs related to the keep warm state allow the user to adjust the tradeoff between faster startup and lower power during the keep warm state. The knobs can be implemented with non-volatile registers such as memory locations in FLASH memory 114 as well as volatile registers that are set based on run-time calibration. In addition, digital control requires less integrated circuit area and can use structures already present in conventional MCUs, such as CPU core 111 for control and FLASH memory 114 for parameter storage.

In other embodiments, crystal resonator 122 can be replaced by any other suitable frequency reference element, such as a ceramic oscillator, a piezoelectric element, a surface acoustic wave (SAW) element, and the like. Moreover while oscillator core circuit 210 is illustrated as a Pierce oscillator, in other embodiments oscillator core circuit 210 can be a Colpitts oscillator or can use any other suitable oscillator architecture.

In oscillator core circuit 210, the negative loop gain element is implemented with transconductance amplifier 213 with a negative transconductance, but in other embodiments it could be implemented with a voltage amplifier, a voltage comparator, an inverter, or with any other amplification element having programmable gain. Variable current source 216 can be implemented in a variety of ways, such as by a series of equally valued switched current sources, a series of binarily-weighted switched current sources, or some combination of the two.

Digital controller 226 can be implemented with various forms of digital circuitry including a hardware circuit, software running on a processor such as CPU core 111, or some combination of the two. In the illustrated embodiment, digital controller 226 implements most of the control functions with dedicated hardware circuitry, including a finite state machine, while implementing some functions with firmware running on CPU core 111. In addition digital controller stores parameters in FLASH memory 114 and/or RAM 115.

Figure 3:
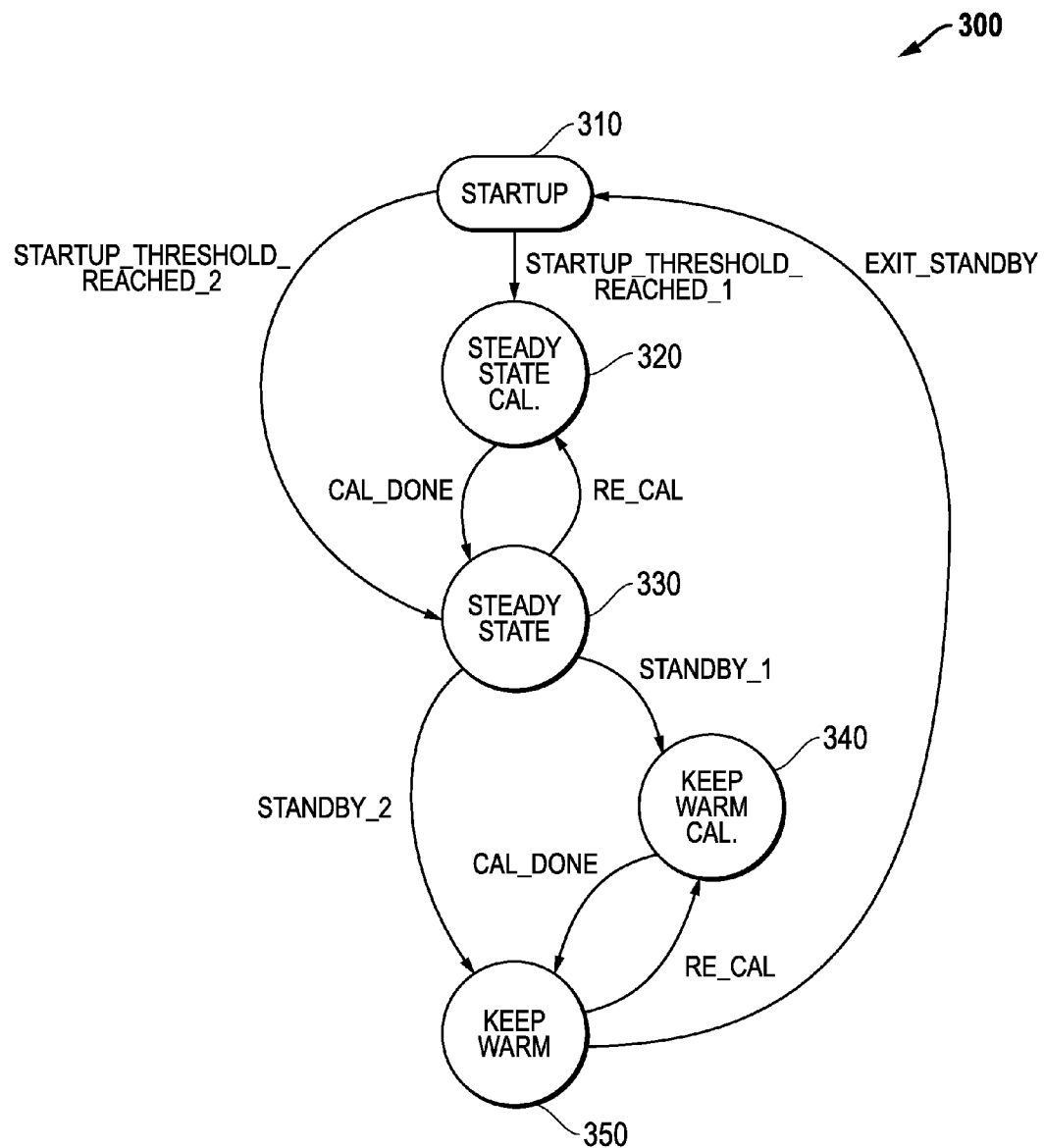
FIG. 3 illustrates a state diagram of the digital controller of FIG. 2.

FIG. 3 illustrates a state diagram 300 of digital controller 226 of FIG. 2. On cold startup, oscillator 200 enters a startup state 310, in which oscillator core circuit 210 begins oscillating. Oscillator core circuit 210 may require, for example, about 200 microseconds (μs) to complete startup and establish stable oscillations at an acceptable amplitude. Digital controller 226 applies a startup value for $I_{CONTROL}$, designated "$I_{STARTUP}$". Digital controller 226 uses high gain and thus it is relatively high to allow for fast startup over a wide range of crystal resonator specifications and in all integrated circuit processing corner conditions. Once it has output $I_{STARTUP}$ and the $CLK_1$ amplitude starts to increase, it closes switch 222 and enables peak detector 224 and sets $V_{TH}$ to a threshold equal to the targeted steady-state amplitude. Since the gain is set to a relatively high setting, the amplitude of the $CLK_1$ signal increases at a high rate, thus reducing startup time and possibly also saving power due to the shorter startup period.

Digital controller 226 measures the end of startup state 310 by determining whether the peak of the oscillations has reached the programmed startup threshold for $V_{TH}$. Once the oscillations have reached a first startup threshold, digital controller 226 can transition to a steady state calibration state 320 by a path labeled "STARTUP_THRESHOLD_REACHED_1".

In steady state calibration state 320, digital controller 226 calibrates a value of $I_{CONTROL}$ labeled "$I_{STEADYSTATEC}$" that is lower than $I_{STARTUP}$ but sufficient to maintain oscillation during steady state. Digital controller 226 repetitively and iteratively changes $I_{CONTROL}$ and measures peak amplitude using $V_{TH}$. The step size for $I_{CONTROL}$ is made low enough to achieve current consumption in steady state at near-minimum levels. However to support a wide range of crystal resonator frequencies, the overall range of $I_{CONTROL}$ must be large and can vary, for example, by several orders of magnitude.

In one particular embodiment, digital controller 226 starts from a programmable level for $I_{CONTROL}$ labeled "$I_{STEADYSTATE0}$" that is higher than the ultimate calibration target, and lowers $I_{CONTROL}$ iteratively until it determines the amplitude has fallen below $V_{TH}$. When the amplitude falls below $V_{TH}$, digital controller 226 sets the value of $I_{STEADYSTATEC}$ to the previous value and stores $I_{STEADYSTATEC}$ in FLASH memory 114. At that time, calibration ends and digital controller 226 transitions to a steady state 330 by a path labeled "CAL_DONE". Note however that steady-state calibration is smooth enough so that oscillator 200 makes $CLK_{OUT}$ available to MCU 100 at the end of startup state 310.

At the end of startup state 310 digital controller 226 can also determine that steady state calibration has already been performed and retrieve the value of $I_{STEADYSTATEC}$ from FLASH memory 114. It applies $I_{STEADYSTATEC}$ to variable current source 216 and enters steady state 330 without performing a calibration by a path labeled "STARTUP_THRESHOLD_REACHED_2".

In steady state 330, oscillator core circuit 210 operates at greatly reduced and near-minimum power consumption levels using $I_{STEADYSTATEC}$. Peak detector 224 and the state machine in digital controller 226 are turned off, and only oscillator core circuit 210 and buffer 240 draw current. From steady state 330 it is possible to re-calibrate $I_{STEADYSTATEC}$ on a periodic basis to account for changes in the operating environment such as temperature and power supply voltage as well as dynamic loading caused by software. If this programmable option is selected, digital controller 226 performs a recalibration by transitioning to steady state calibration state 320 by a path labeled "RE_CAL".

MCU 100 incorporates various chip-wide low power modes. In some of those modes, the internal circuitry becomes inactive and does not need to be clocked using the $CLK_{OUT}$ signal. In response to MCU 100 going into one of those low power modes, digital controller 226 places oscillator 200 into a keep warm state 350. Before entering keep warm state 350, digital controller 226 may perform a keep warm calibration by transitioning to a keep warm calibration state 340 by a path labeled "STANDBY_1". In keep warm calibration state 340, digital controller 226 closes switch 222 and repetitively and iteratively changes $I_{CONTROL}$ and observes the output of peak detector 224. In one particular embodiment, digital controller 226 starts from $I_{STEADYSTATEC}$, and lowers $I_{CONTROL}$ iteratively until the amplitude falls below $V_{TH}$. Once oscillations falls below $V_{TH}$, the calibration ends and digital controller 226 opens switch 222 and transitions to keep warm state 350 by a path similarly labeled "CAL_DONE". Digital controller 226 then stores the calibrated value of $I_{CONTROL}$ as a value known as "$I_{KEEPWARM}$" in FLASH memory 114.

Alternatively digital controller 226 can determine that keep warm calibration has already been performed and retrieve the value of $I_{KEEPWARM}$ from FLASH memory 114. In this case it applies $I_{KEEPWARM}$ to variable current source 216 and enters steady state 330 by a path labeled "STANDBY_2".

When oscillator 200 leaves keep warm state 350, such as in response to MCU 100 exiting the corresponding low power state, digital controller 226 transitions back to startup state 310 by a path labeled "EXIT_STANDBY". Digital controller 226 then stays in and exits startup state 310 as described above.

The values of the variables used during calibration are summarized in TABLE I:

TABLE I

| Variable | Value | Programmable? |
|---|---|---|
| $I_{CONTROL}$ | $I_{STARTUP}$ | Y |
| $I_{CONTROL}$ | $I_{STEADYSTATE0}$ | Y |
| $I_{CONTROL}$ | $I_{STEADYSTATEC}$ | N |
| $I_{CONTROL}$ | $I_{KEEPWARM}$ | N |
| $V_{TH}$ | Varies based on state | Y |

Steady state and keep warm calibrations take relatively long times, but digital controller 226 provides the capability of performing one-time steady state and keep warm calibrations and storing their results in FLASH 114 so that these modes can be bypassed.

Digital controller 226 also implements a failsafe mechanism by monitoring the clock amplitude periodically during the steady state and the keep warm state to detect a failure of the power supply voltage or some other extraordinary condition. The failsafe mechanism is triggered in response to a transition of low frequency clock signal $CLK_{LF}$. In response to the trigger if the amplitude of oscillations has fallen below $V_{TH}$, which digital controller 226 sets at one step below steady-state $V_{TH}$, then digital controller 226 increases $I_{CONTROL}$. For example, digital controller 226 could increment $I_{CONTROL}$ by an amount corresponding to its least significant bit. During normal operating conditions, the amplitude does not fall below this slightly lowered $V_{TH}$, and no action is taken. The failsafe mechanism leverages the characteristic of crystal resonator oscillators that oscillations are slow to die out even when power is removed, and will not die out completely in the period defined by one cycle of $CLK_{LF}$. Moreover in battery powered applications, for example when MCU 100 is powered by a coin cell battery that provides a very long operating life, the failsafe mechanism keeps oscillator 200 oscillating with only a minimal amount of increased power consumption as the battery voltage slowly drops over its life. For example, if $CLK_{LF}$ has a frequency of 1 kilohertz (kHz), the failsafe check requires only 5 is to operate once every 1 ms.

Digital controller 226 also incorporates a feature that known as scaled calibration. According to the scaled calibration feature, digital controller 226 scales the current steps in variable current source 216 scale in an amount corresponding to the size of the current. For example the step size can be made proportional to the value of $I_{CONTROL}$ divided by eight, which allows digital controller 226 to compute the step size by a simple binary shift and add rather than requiring a complex a multiplication.

Figure 4:
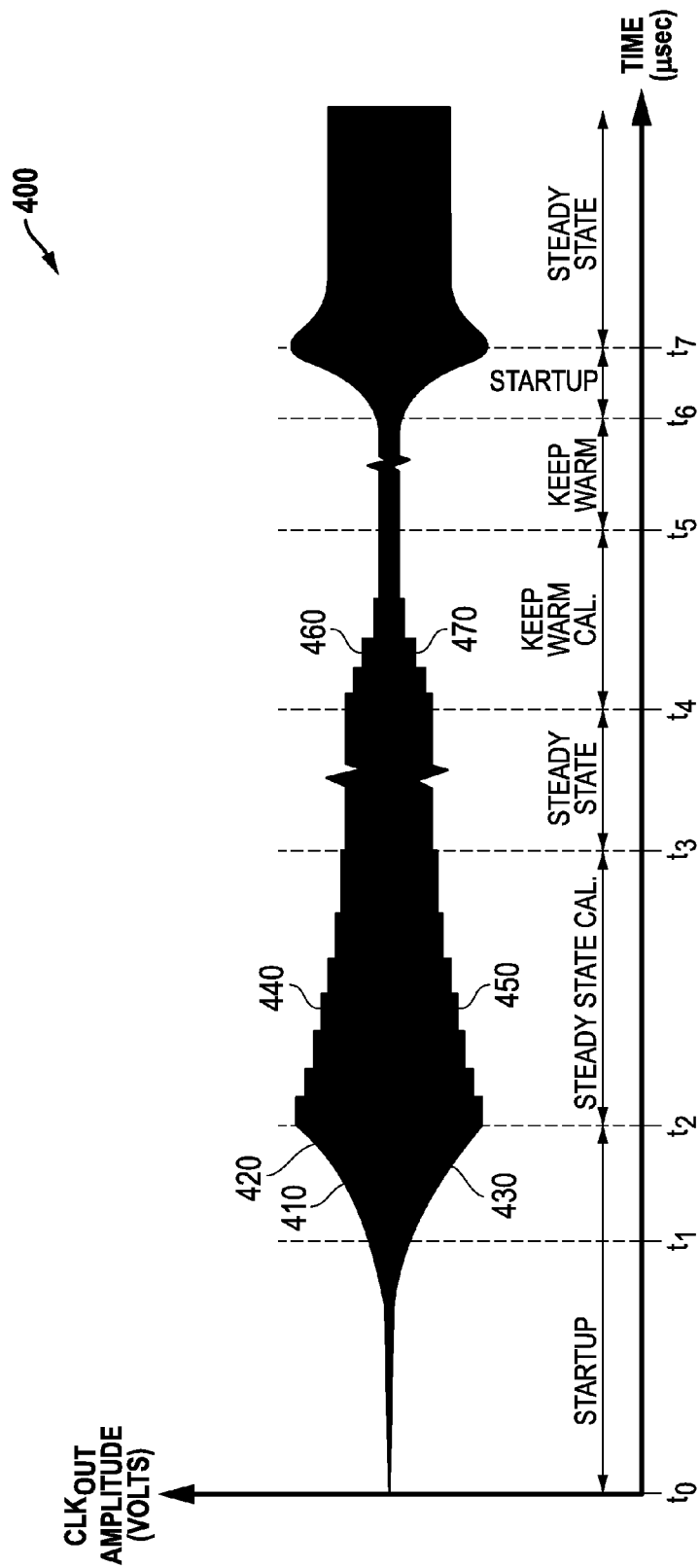
FIG. 4 illustrates a timing diagram useful in understanding the operation of the oscillator of FIG. 2.

FIG. 4 illustrates a timing diagram 400 useful in understanding the operation of oscillator 200 of FIG. 2. In timing diagram 400, the horizontal axis represents time in μs and the vertical axis represents the amplitude of $CLK_1$ in volts.

A waveform 410 illustrates the amplitude of $CLK_1$ in which the gray area represents periods of oscillation, a first waveform represents the envelope 420 of the high peak voltages of $CLK_1$, and a second waveform represents the envelope 430 of the low voltages of $CLK_1$. Shown along the horizontal axis are eight time points of interest, labeled "$t_0$" through "$t_7$".

At $t_0$, power is applied to MCU 100 and oscillator 200 enters startup state 310. During the time from $t_0$ to $t_1$, oscillations are beginning and building up from noise. During the time from $t_1$ to $t_2$, oscillations are increasing in amplitude. At time $t_2$, oscillations reach $V_{TH}$.

During the time from $t_2$ to $t_3$, oscillator 200 is in steady state calibration state 320. During steady state calibration, digital controller 226 reduces $I_{CONTROL}$ from $I_{STEADYSTATE0}$ to the calibrated value of $I_{STEADYSTATEC}$, as shown by a series of discrete steps 440 of envelope 420 and discrete steps 450 of envelope 430. Note that the time periods of timing diagram 400 are not drawn to scale, and the time from $t_0$ to $t_2$ is significantly shorter than the time period from $t_2$ to $t_3$.

During the time from $t_3$ to $t_4$, oscillator 200 is in steady state 330. During steady state 330, oscillator 200 generates the $CLK_{OUT}$ signal using the gain value of $I_{STEADYSTATEC}$. The length of this period varies according to the operation of MCU 100. In addition, MCU 100 may optionally re-calibrate $I_{CONTROLC}$. However re-calibration, if any, is only performed occasionally due to the length of time required for recalibration.

As shown in timing diagram 400, MCU 100 determines that oscillator 200 will enter keep warm state 350 at around time t4. Prior to entering keep warm state 350, oscillator 200 enters keep warm calibration state 340 and performs keep warm calibration from time $t_4$ to $t_5$. During keep warm calibration, digital controller 226 further reduces $I_{CONTROL}$ from $I_{STEADYSTATEC}$ to the calibrated value of $I_{KEEPWARM}$, as shown by a series of discrete steps 460 of envelope 420 and discrete steps 470 of envelope 430. At time $t_5$, digital controller 226 determines the value of $I_{KEEPWARM}$ and stores it in FLASH memory 114.

During the time from $t_5$ to $t_6$, oscillator 200 is in keep warm state 350. During keep warm state 350, digital controller 226 opens switch 222 and oscillator core circuit 210 continues to oscillate but at a greatly reduced amplitude. Oscillator core circuit 210 continues to provide the $CLK_1$ signal at the reduced gain value of $I_{KEEPWARM}$. The length of this period also varies according to the operation of MCU 100. In steady state the amplitude is higher than in the keep warm because it must be sufficient for buffer 240 to operate reliably and provide a valid $CLK_{OUT}$ signal. In contrast during the keep warm state, there no need for buffer 240 to operate nor to provide a valid $CLK_{OUT}$ signal, so the amplitude of oscillation can be lower and thereby save move current.

At time $t_6$, MCU 100 leaves the low power state and oscillator 200 leaves keep warm state 350 by transitioning back to startup state 310. During the time from $t_6$ to $t_7$, digital controller 226 keeps switch 222 open, and oscillator core circuit 210 increases the amplitude of oscillations until it reaches the $V_{TH}$ defined for startup. Since oscillator core 210 has continued to oscillate stably at low amplitude, the time from $t_6$ to $t_7$ is shorter than the time from $t_1$ to $t_2$. Thus, keep warm state 350 is suitable for quick restart at the cost of a relatively small amount of power and preserves very low power operation while adding flexibility.

The above-disclosed subject matter is to be considered illustrative, and not restrictive, and the appended claims are intended to cover all such modifications, enhancements, and other embodiments that fall within the true scope of the claims. For example, the oscillator can be formed with other frequency reference elements besides quartz crystals, such as ceramic resonators. Moreover while the disclosed embodiment showed a Pierce oscillator, other oscillator configurations, such as Colpitts, may be used. Also digital controller 226 can be implemented with various combinations of hardware and software, and clock buffer 240 can also be implemented with various circuits.

Thus, to the maximum extent allowed by law, the scope of the present invention is to be determined by the broadest permissible interpretation of the following claims and their equivalents, and shall not be restricted or limited by the foregoing detailed description.

What is claimed is:

1. An oscillator comprising:
   an oscillator core circuit for connection to a frequency reference element for providing a first clock signal using a negative gain element having a gain determined by a gain control signal;
   a dynamic gain control circuit for providing said gain control signal to set an absolute value of said gain to a first level during a startup state, and changing said gain control signal to reduce said absolute value of said gain to a second level lower than said first level after said first clock signal has reached a steady state, wherein said dynamic gain control circuit comprises:
      an amplitude determination circuit for comparing an amplitude of oscillations of said first clock signal to a voltage threshold signal; and
      a digital controller for providing said voltage threshold signal at a first threshold and said gain control signal at a first gain corresponding to said first level of said absolute value of said gain during said startup state, and changing from said startup state to said steady state in response to said amplitude determination circuit comparing said amplitude of oscillations of said first clock signal to said voltage threshold signal,
   wherein said digital controller is further programmable to calibrate said gain control signal to a second gain for operation in said steady state after setting said voltage threshold signal to a second threshold.

2. The oscillator of claim 1, wherein said amplitude determination circuit comprises a peak detector.

3. The oscillator of claim 1, wherein said first and second gains and said first threshold are programmable.

4. The oscillator of claim 3, wherein said digital controller is further programmable to calibrate said gain control signal to a third gain lower than said second gain for operation in a keep warm state.

5. The oscillator of claim 4, wherein said digital controller calibrates said third gain starting with a programmable initial gain.

6. The oscillator of claim 4, wherein said digital controller enters said startup state in response to exiting said keep warm state.

7. An oscillator comprising:
   an oscillator core circuit having a first external terminal for connection to a frequency reference element, a second external terminal for connection to said frequency reference element, and an output for providing a first clock signal by providing a negative gain between said first external terminal and said second external terminal in response to a gain control signal;
   a peak detector having an input for receiving said first clock signal, a control input for receiving a voltage threshold signal, and an output for providing an amplitude detection signal in response to a comparison of a peak of said first clock signal to said voltage threshold signal; and
   a digital controller having an input for receiving said amplitude detection signal, a first output for providing said voltage threshold signal, and a second output for providing said gain control signal, wherein said digital controller is programmable to vary said voltage threshold and said gain control signal in response to said amplitude detection signal to programmably start up the oscillator and operate the oscillator in a steady state, wherein said digital controller is further programmable to vary said voltage threshold and said gain control signal in response to said amplitude detection signal to programmably calibrate the oscillator for said steady state.

8. The oscillator of claim 7, wherein said oscillator core circuit comprises:
   a transconductance amplifier having an input terminal coupled to said first external terminal, an output terminal coupled to said second external terminal, and a control terminal for receiving a bias current;
   a first variable capacitor having a first terminal coupled to said first external terminal, a second terminal coupled to a voltage reference terminal;
   a second variable capacitor having a first terminal coupled to said second external terminal, a second terminal coupled to said voltage reference terminal; and
   a variable current source having a control input for receiving said gain control signal, and an output coupled to said control terminal of said transconductance amplifier for providing said bias current in response to said gain control signal.

9. The oscillator of claim 7, wherein said digital controller is further programmable to vary said voltage threshold and said gain control signal in response to said amplitude detection signal to programmably operate the oscillator in a keep warm state, wherein in said keep warm state said the oscillator continues to oscillate but said first clock signal has a lower amplitude than in said steady state, and to programmably calibrate said gain control signal for said keep warm state.

10. The oscillator of claim 7, wherein said digital controller is further programmable to set said gain control signal to a previously calibrated state in response for operation in said steady state.

11. The oscillator of claim 7, further comprising a buffer having an input for receiving said first clock signal, and an output for providing a second clock signal.

12. The oscillator of claim 11, wherein said buffer comprises:
   a capacitor having a first terminal for receiving said first clock signal, and a second terminal;
   an inverter having an input coupled to said second terminal of said capacitor, and an output for providing said second clock signal; and
   a resistor having a first terminal coupled to said output of said inverter, and a second terminal coupled to said input of said inverter.

13. The oscillator of claim 7, wherein said digital controller comprises:
   at least one non-volatile register for storing a plurality of parameters associated with an operation of said digital controller.

14. The oscillator of claim 7, wherein said digital controller further comprises a central processing unit for controlling an operation of said oscillator core circuit in response to a control program.

15. A method comprising:
starting up an oscillator core circuit using a first gain in a startup state;
detecting an end of said startup state;
operating said oscillator core circuit in a steady state using a second gain to produce a clock signal, said second gain having an absolute value less than said first gain;
calibrating said oscillator core circuit to obtain a third gain, said third gain having an absolute value less than said second gain; and
operating said oscillator core circuit in a keep warm state using said third gain value.

16. The method of claim 15 further comprising:
calibrating said oscillator core circuit to obtain said second gain.

17. The method of claim 15 further comprising:
exiting said keep warm state and returning to said startup state; and
starting up said oscillator core circuit using said first gain in said startup state; and
resuming operation of said oscillator core circuit in said steady state using said second gain to produce said clock signal without re-calibrating said oscillator core circuit.

18. The method of claim 17 further comprising:
storing said second gain value in a volatile register; and
retrieving said second gain value from said volatile register prior to said resuming operation of said oscillator core circuit in said steady state.

19. The method of claim 15 wherein said starting up said oscillator core circuit using said first gain comprises:
retrieving said first gain from a non-volatile memory.

20. An oscillator comprising:
an oscillator core circuit for connection to a frequency reference element for providing a first clock signal using a negative gain element having a gain determined by a gain control signal; and
a dynamic gain control circuit for providing said gain control signal to set an absolute value of said gain to a first level during a startup state, changing said gain control signal to reduce said absolute value of said gain to a second level lower than said first level in response to detecting that said first clock signal has reached a steady state, and changing said gain control signal to reduce said absolute value of said gain to a third level lower than said second level when said oscillator is in a keep warm state in response to detecting an entry into a low power mode.

21. The oscillator of claim 20, wherein:
said dynamic gain control circuit further changes said gain control signal to increase said absolute value of said gain to said second level when said oscillator returns to said steady state from said keep warm state.

22. A method comprising:
starting up an oscillator core circuit using a first gain in a startup state;
detecting an end of said startup state; and
operating said oscillator core circuit in a steady state using a second gain to produce a clock signal, said second gain having an absolute value less than said first gain;
detecting an entry into a low power mode; and
operating said oscillator core circuit in a keep warm state using a third gain having an absolute value less than said second gain in response to said detecting said entry into said low power mode.

23. The method of claim 22 further comprising:
calibrating said oscillator core circuit to obtain said second gain in response to detecting said end of said startup state; and
calibrating said oscillator core circuit to obtain a third gain in response to detecting said entry into said low power mode.

* * * * *